United States Patent
Diazzi et al.

(10) Patent No.: US 11,591,209 B2
(45) Date of Patent: Feb. 28, 2023

(54) METHOD FOR OPERATING A CAPACITIVE MEMS SENSOR, AND CAPACITIVE MEMS SENSOR

(71) Applicant: Robert Bosch GmbH, Stuttgart (DE)

(72) Inventors: Francesco Diazzi, Munich (DE); Andrea Visconti, Munich (DE); Luca Valli, Munich (DE)

(73) Assignee: Robert Bosch GmbH, Stuttgart (DE)

( * ) Notice: Subject to any disclaimer, the term of this patent is extended or adjusted under 35 U.S.C. 154(b) by 53 days.

(21) Appl. No.: 17/296,862

(22) PCT Filed: Jan. 20, 2020

(86) PCT No.: PCT/EP2020/051225
§ 371 (c)(1),
(2) Date: May 25, 2021

(87) PCT Pub. No.: WO2020/169283
PCT Pub. Date: Aug. 27, 2020

(65) Prior Publication Data
US 2022/0024755 A1 Jan. 27, 2022

(30) Foreign Application Priority Data
Feb. 21, 2019 (DE) .......................... 102019202326.6

(51) Int. Cl.
*G01C 19/5776* (2012.01)
*B81B 3/00* (2006.01)

(52) U.S. Cl.
CPC ........ *B81B 3/0021* (2013.01); *G01C 19/5776* (2013.01); *B81B 2201/0242* (2013.01)

(58) Field of Classification Search
CPC .......... B81B 3/0021; B81B 2201/0242; B81B 7/008; G01C 19/5776
See application file for complete search history.

(56) References Cited

U.S. PATENT DOCUMENTS 5,747,951 A   5/1998 Ward et al.
9,006,832 B2  4/2015 Shaeffer et al.
(Continued)

FOREIGN PATENT DOCUMENTS

DE   112013000589 T5   3/2015
JP   2006170620 A      6/2006
(Continued)

OTHER PUBLICATIONS

International Search Report for PCT/EP2020/051225, dated May 7, 2020.

*Primary Examiner* — David J Bolduc
(74) *Attorney, Agent, or Firm* — Norton Rose Fulbright US LLP; Gerard Messina

(57) ABSTRACT

A method for operating a capacitive MEMS sensor. The method includes: supplying a defined electrical potential on a deflectably mounted, seismic mass of the MEMS sensor; capacitively inducing a vibrational motion of the seismic mass with the aid of a clocked electrical control voltage; compensating for fluctuations in the supplied electrical potential on the seismic mass caused by the clocked electrical control voltage, by selectively charging and/or discharging an electrical storage element connected to the seismic mass in accordance with the frequency of the clocked electrical control voltage.

16 Claims, 3 Drawing Sheets

(56) References Cited

U.S. PATENT DOCUMENTS

| | | | | |
|---|---|---|---|---|
| 2011/0179868 A1* | 7/2011 | Kaino | ................ | G01C 19/5776 |
| | | | | 73/504.12 |
| 2012/0242400 A1* | 9/2012 | Shaeffer | ................ | H01L 27/092 |
| | | | | 327/535 |
| 2013/0340524 A1* | 12/2013 | Maeda | ................ | G01P 15/0888 |
| | | | | 73/514.02 |
| 2014/0318244 A1* | 10/2014 | Tsutsumi | ........... | G01C 19/5776 |
| | | | | 73/504.12 |
| 2016/0011254 A1* | 1/2016 | Maeda | ................ | G01R 31/2829 |
| | | | | 324/538 |
| 2018/0335444 A1 | 11/2018 | Cassagnes et al. | | |

FOREIGN PATENT DOCUMENTS

| | | | |
|---|---|---|---|
| JP | 2007285936 A | 11/2007 | |
| JP | 2015210137 A | 11/2015 | |

* cited by examiner

METHOD FOR OPERATING A CAPACITIVE MEMS SENSOR, AND CAPACITIVE MEMS SENSOR

FIELD

The present invention relates to a method for operating a capacitive MEMS sensor.

The present invention further relates to a capacitive MEMS sensor.

Although the present invention is applicable generally to any capacitive MEMS sensors, the present invention is explained with reference to a MEMS sensor in the form of a gyroscope.

BACKGROUND INFORMATION

In the case of gyroscopes, a flexibly mounted mass, a seismic mass, is induced to vibrate by a suitable control circuit of an application-specific integrated circuit, abbreviated as ASIC, and to be more precise, it is induced to vibrate preferably at the resonant frequency of the respective sensor element. With the aid of electrodes, one on the seismic mass, one stationary, which form, together, a capacitor, electrostatic energy is transmitted onto the seismic mass. In this context, the electrodes are acted upon by a variable voltage. To this end, for example, a clocked voltage may be used, which corresponds to the resonant frequency of the vibrating seismic mass.

The voltage signal is supplied, for example, by a high-voltage control loop, in order to increase the charge sensitivity and to allow reduced noise at a low current. In this context, the magnitude of the voltage is normally higher than that supplied by a grid operator, which means that suitable charge pumps are used here.

Such a high-voltage control loop is described in U.S. Pat. No. 9,006,832 B2. U.S. Pat. No. 9,006,832 B2 shows a high-voltage MEMS system, which is compatible with low-voltage semiconductor process technology and includes a MEMS device that is coupled to a high-voltage bias generator; the high-voltage bias generator utilizing expanded voltage insulation, which is situated in a semiconductor substrate. The system dispenses with the use of high-voltage transistors, which means that special high-voltage processing steps may be omitted, and consequently, processing costs and the degree of complexity are reduced. The option of testing the MEMS is permitted by a self-testing circuit, which enables modulation of the biasing voltage and the current, so that external high-voltage connections and associated electrostatic discharge protection circuits may be omitted.

SUMMARY

In one specific embodiment, the present invention provides a method for operating a capacitive MEMS sensor, including the following steps:
supplying a defined electrical potential on a deflectably mounted, seismic mass of the MEMS sensor;
capacitively inducing a vibrational motion of the seismic mass with the aid of a clocked electrical control voltage;
compensating for fluctuations in the supplied electrical potential on the seismic mass caused by the clocked electrical control voltage, by selectively charging and/or discharging an electrical storage element connected to the seismic mass in accordance with the frequency of the clocked electrical control voltage.

In one specific embodiment, the present invention provides a capacitive MEMS sensor, including:
a deflectably mounted, seismic mass;
a circuit device for supplying a defined electrical potential on the seismic mass;
an excitation device for capacitively setting the seismic mass into vibrational motion;
a driving device for supplying a clocked electrical control voltage, in order to capacitively induce a vibrational motion of the seismic mass with the aid of the excitation device; and
a compensation device having an electrical storage element, which is connected to the seismic mass, and which is configured to compensate for the fluctuations in the electrical potential on the seismic mass caused by the control voltage, by selectively charging and/or discharging the electrical storage element in accordance with the frequency of the clocked electrical control voltage.

In particular, herein, the step "capacitively inducing a vibrational motion of the seismic mass" is to be understood as the initiation, excitation, driving, or the like, of a seismic mass, so that it carries out a vibrational motion. In this connection, in particular, one or more electrodes, which are not situated on the seismic mass, interact with one or more electrodes situated on the seismic mass. In this case, in particular, the seismic mass itself may take the form of an electrode. One or more capacitors are formed by the interaction of the electrodes situated, on one hand, on the seismic mass and, on the other hand, not on the seismic mass. Consequently, the term "capacitive induction" is to be understood to mean, in particular, that a vibrational motion of the seismic mass takes place or is at least initiated, by changing the one or more capacitances with the aid of an electrical voltage at one electrode.

Preferably, herein, with regard to the electrical potential, the term "fluctuation" is to be understood as any temporal change in the magnitude of the electrical potential. In particular, a reduction or increase in the electrical potential on the seismic mass is to be understood as a fluctuation. In this connection, the fluctuation is, in particular, not to be understood exclusively as a deviation from a specified mean. Therefore, the term "fluctuation" is to be understood in the broadest sense and, herein, preferably relates to any change, deviation, variation or the like.

With regard to the vibrational motion of the seismic mass, the term "monitoring" is to be understood in the broadest sense, and, herein, this relates to at least partially continuous detection, determination, sensing or the like, of variables describing or characterizing the vibrational motion, such as position, speed, acceleration, or other variables of the motion of the seismic mass differentiated with respect to time. Likewise with regard to the vibrational motion, herein, the term "monitoring" is further to be understood to mean that the execution of an action or the like takes place, if a specifiable or predefined change is detected or ascertained and/or occurs.

With regard to phase or amplitude of the vibrational motion, herein, the term "control" is to be understood as at least intermittent, in particular, continuous adjustment of phase and/or amplitude for providing and/or maintaining a desired, defined, or specified vibrational motion of the seismic mass.

With regard to the phase of the electrical control voltage, herein, the term "coupling" of a signal is to be understood as a generated signal corresponding to the phase of the electrical control voltage. With regard to the phase of the electrical control voltage, in particular, the term "coupling" is not to be understood as phase coupling by a phase coupler.

One of the advantages attained by this is that, consequently, the potential on the seismic mass may be held constant in a direct manner with the aid of a suitable, clocked voltage. This reduces the demands on the high-voltage control loop with regard to bandwidth, reduces the total space of the capacitive MEMS sensor overall, and decreases the power consumption. The deflectably mounted, seismic mass may be supported, in particular, by springs.

Further features, advantages and additional specific embodiments of the present invention are described in the following or become apparent from it.

According to one advantageous further refinement of the present invention, the vibrational motion of the seismic mass is monitored, and the clocked electrical control voltage is adjusted, in order to maintain a selected vibrational motion of the seismic mass. One of the advantages attained by this is control of the vibrational motion of the seismic mass that is simple and reacts rapidly to changes.

According to another advantageous further refinement of the present invention, a phase and/or an amplitude of the vibrational motion of the seismic mass is measured, and the phase and/or amplitude of the clocked electrical control voltage are controlled to provide a defined vibrational motion of the seismic mass. Consequently, the vibrational motion of the seismic mass may be controlled in a particularly simple and reliable manner.

According to another advantageous further refinement of the present invention, a control signal is generated, which is coupled to a phase of the clocked electrical control voltage, and by which the selective charging and/or discharging of the electrical storage element is initiated. Thus, charging and/or discharging in accordance with the frequency may be provided in a simple and simultaneously reliable manner.

According to another advantageous further refinement of the present invention, the charge on the seismic mass to be compensated for is determined as a product of the amplitude of the vibrational motion of the seismic mass, magnitude of the clocked electrical control voltage and an operational sensitivity of the capacitance as a function of the deflection and the charging current for the electrical storage element in the form of a product of two times the resonant frequency of an oscillator of the seismic mass and the charge to be compensated for. One of the advantages achieved by this is simple determination of the charge to be compensated for and the charging current of the storage element.

According to one advantageous further refinement of the MEMS sensor in accordance with the present invention, the circuit device includes at least one charge pump, which is connected to the seismic mass. Consequently, a charge and, therefore, a defined electrical potential may be provided on the seismic mass in a reliable manner.

According to another advantageous further refinement of the MEMS sensor in accordance with the present invention, the circuit device is configured to monitor the electrical potential on the seismic mass and to control it in accordance with a predefined reference voltage. This allows the electrical potential on the seismic mass to be determined and possibly adjusted in a simple manner.

According to another advantageous further refinement of the MEMS sensor in accordance with the present invention, to provide the clocked electrical control voltage, the driving device includes a circuit arrangement for monitoring the vibrational motion of the seismic mass, in particular, a circuit arrangement for ascertaining changes in an amplitude and/or phase of the vibrational motion of the seismic mass. One of the advantages achieved by this is reliable adjustment of the clocked electrical control voltage.

According to another advantageous further refinement of the MEMS sensor in accordance with the present invention, the driving device includes at least one amplitude controller and/or a phase controller for controlling the amplitude and/or phase of the clocked electrical control voltage, in order to maintain a defined vibrational motion of the seismic mass. One of the advantages achieved by this is flexible adjustment of the clocked electrical control voltage.

According to another advantageous further refinement of the MEMS sensor in accordance with the present invention, the driving device is connected to the compensation device, and this is configured to transmit a control signal to the compensation device in accordance with the frequency of the electrical control voltage; the compensation device being configured to selectively charge and/or discharge the storage element in accordance with the control signal. One advantage of this is rapid, reliable, and simple compensation for fluctuations in the potential on the seismic mass.

According to another advantageous further refinement of the MEMS sensor in accordance with the present invention, the compensation device includes at least one current source for charging the electrical storage element and at least one switch for discharging the electrical storage element; and the at least one switch being able to be operated via the control signal of the driving device. An advantage of this is simple implementation of a compensation device.

According to another advantageous further refinement of the MEMS sensor in accordance with the present invention, the electrical storage element takes the form of a passive electrical storage element, in particular, a capacitor. An advantage of this is that particularly cost-effective and simple storage of electrical energy is possible.

According to another advantageous further refinement of the MEMS sensor in accordance with the present invention, the at least one current source includes a digital-to-analog converter having a current output, which is configured to provide a plurality of selectable current generators. An advantage of this is reliable and rapid charging of the storage element, while simultaneously maintaining a cost-effective construction.

According to another advantageous further refinement of the present invention, the MEMS sensor takes the form of a gyroscope. An advantage of this is that a particularly reliably operable and cost-effective gyroscope is provided.

Additional, important features and advantages of the present invention follow from the figures, and from the corresponding description of the figures.

It is understood that the features mentioned above and still to be explained below may be used not only in the respectively indicated combination, but also in other combinations, or by themselves, without departing from the scope of the present invention.

Preferred variants and specific embodiments of the present invention are shown in the figures and are explained in more detail in the following description, where identical reference numerals denote the same or similar or functionally identical components or elements.

DETAILED DESCRIPTION OF EXAMPLE EMBODIMENTS

Figure 1:
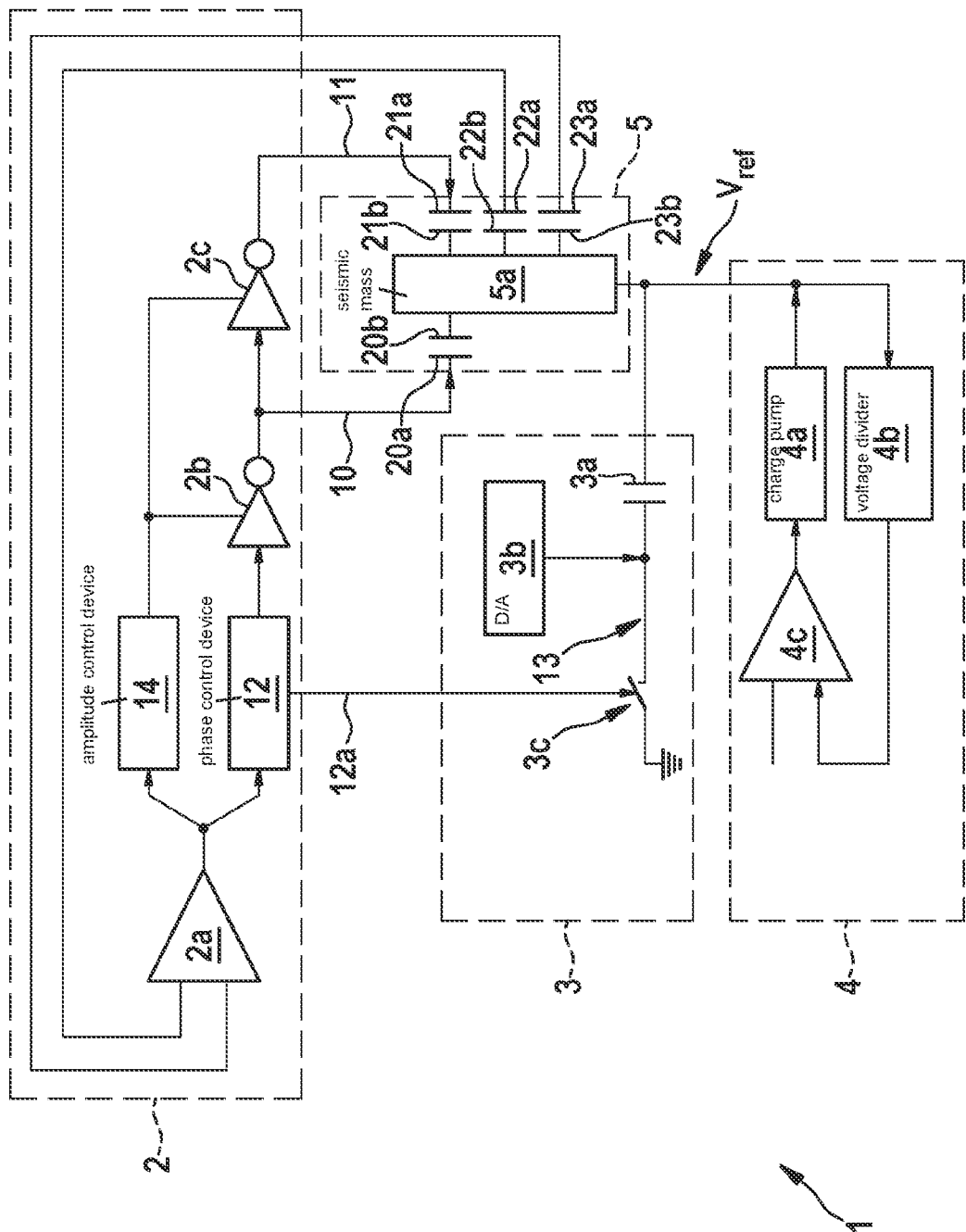
FIG. 1 shows a MEMS sensor according to a specific embodiment of the present invention.

FIG. 1 shows a MEMS sensor according to a specific embodiment of the present invention.

The components of a MEMS sensor 1 used for explaining the present invention are represented schematically in FIG. 1. MEMS sensor 1 includes a seismic mass 5a, which is deflectably mounted, in this case, elastically supported, and may be induced to vibrate in at least one first spatial direction, and whose displacements in at least one second spatial direction may be measured capacitively. In this connection, the first and second spatial directions may also be identical. In addition, MEMS sensor 1 includes a circuit device 4 for providing a defined electrical potential on seismic mass 5a; an excitation device including driving electrodes 20a, 21a, which are for exciting seismic mass 5a capacitively and interact with counter-electrodes 20b, 21b on seismic mass 5a to produce a vibrational motion with the aid of a clocked electrical control voltage 10, 11; a driving device 2 for providing clocked electrical control voltage 10, 11; and a compensation device 3 having an electrical storage element 3a. Compensation device 3 is connected to seismic mass 5a and formed in such a manner, that the fluctuations in the electrical potential on seismic mass 5a caused by control voltage 10, 11 are compensated for, by selectively charging and/or discharging storage element 3a in accordance with the frequency of clocked electrical control voltage 10, 11.

In this context, driving device 2 includes a measuring circuit having a current-to-voltage converter 2a, and further electrical components 2b, 2c. On one hand, driving device 2 is connected to driving electrodes 20a, 21a, which, together with corresponding counter-electrodes 20b, 21b on seismic mass 5a, form corresponding capacitors. With the aid of a suitable voltage, these are used to set seismic mass 5a into, in particular, resonant vibration. Furthermore, driving device 2 is connected to measuring electrodes 22a, 23a, which, together with corresponding measuring counter-electrodes 22b, 23b on seismic mass 5a, form, in each instance, capacitors again, and which are used to measure or acquire a position and/or a deflection of seismic mass 5a of MEMS element 5. This position or deflection information is used by a phase control device 12 and an amplitude control device 14, in order to generate a suitable, clocked control voltage 10, 11, by which a defined vibrational motion of seismic mass 5a may be generated and/or maintained. In this connection, amplitude control device 14 is configured to supply a variable voltage, in order to adjust the amplitude of the vibration of seismic mass 5a.

Phase control device 12 is used for keeping the vibrational motion at a specified frequency. With the aid of amplitude control device 14 and phase control device 12, a clocked, square-wave control voltage signal 10, 11 is generated, which is applied to electrodes 20a, 21a. In addition, phase control device 12 provides a signal, in particular, a pulse signal 12a, which is transmitted to compensation device 3.

Compensation device 3 includes a capacitor 3a, which is connected to a digital-to-analog converter 3b having a current output. Digital-to-analog converter 3b includes, in particular, an interface for selecting current generators to charge capacitor 3a. The current supplied by the digital-to-analog converter 3b acting as a current source, referred to below as I_DAC, is advantageously adapted to different parameters of the oscillator formed by seismic mass 5a and its excitation, such as a target equilibrium amplitude motion, resonant frequency, excitation sensitivity, a quality factor, or the like. In addition, there is a switch 3c, by which capacitor 3a may be discharged. In this context, switch 3c is controlled by pulse signal 12a of phase control device 12 in such a manner, that capacitor 3a is discharged synchronously to the clocked, in this case, square-wave, control voltage for driving electrodes 20a, 21a.

In this case, circuit device 4 takes the form of a closed control loop and includes a charge pump 4a, which is connected on the input side to an error amplifier 4c. This closed control loop 4 is formed in such a manner, that a defined electrical potential, which is specified by a reference voltage Vref, is provided on seismic mass 5a. In this context, as already mentioned above, counter-electrodes 20b, 21b on seismic mass 5a interact with driving electrodes 20a, 21a, and measuring counter-electrodes 22b, 23b on seismic mass 5a interact with measuring electrodes 22a, 23a. Error amplifier 4c generates a control signal for charge pump 4a, which supplies a high voltage on seismic mass 5a of MEMS element 5 and receives corresponding feedback via a voltage divider 4b and error amplifier 4c. In a further specific embodiment, circuit device 4 may take the form of an open system having only a charge pump 4a.

Driving device 2, compensation device 3 and closed control loop 4 now work together in such a manner, that the charge Qcg on capacitor 3a from compensation device 3 during a cycle of the control voltage is equal to the charge Qdrive, which is needed, in order to keep the potential on seismic mass 5a constant, when driving electrodes 20a, 21a are acted upon by driving device 2 in a correspondingly synchronized manner, using electric voltage Vdrive. To that end, the current I_DAC provided by digital-to-analog converter 3b to charge capacitor 3a may be adapted suitably:

$$Qcg = I\_DAC/(fdr*2) = Qdrive = xdr*Vdrive*S\_a$$

In this connection

I_DAC=current intensity of the digital-to-analog converter in [A];

fdr=MEMS resonant frequency in [Hz] of the oscillator formed by the seismic mass;

S_a=operational sensitivity, capacitance/deflection, in [F/m];

xdr=amplitude of the motion of the seismic mass in [m]; and Vdrive=driving control voltage in [V].

Capacitor 3a is discharged, by closing switch 3c at the frequency of electrical control voltage 10, 11. In this context, in each instance, as much charge flows out of seismic mass 5a as is additionally provided short-term on seismic mass 5a by an excitation pulse of the clocked control voltage. When switch 3c is open, that is, between two pulse signals 12a, in each instance, capacitor 3a is recharged, namely, by the charge Qdrive expected from a control pulse of electrical control voltage 10, 11. In this manner, changes in the electrical potential on seismic mass 5a, which are caused by control pulses of electrical control voltage 10, 11, may be compensated for, namely, independently of closed control loop 4. These fluctuations in potential are particularly marked, when the control pulses of electrical control voltage 10, 11 occur at the maximum deflection of seismic mass 5a. In each case, the electrical potential on seismic mass 5a indicates only a brief disturbance caused by a control pulse of electrical control voltage 10, 11 and then goes back to the target potential.

The characteristic of the corresponding voltages is shown in the following FIG. 2.

Figure 2:
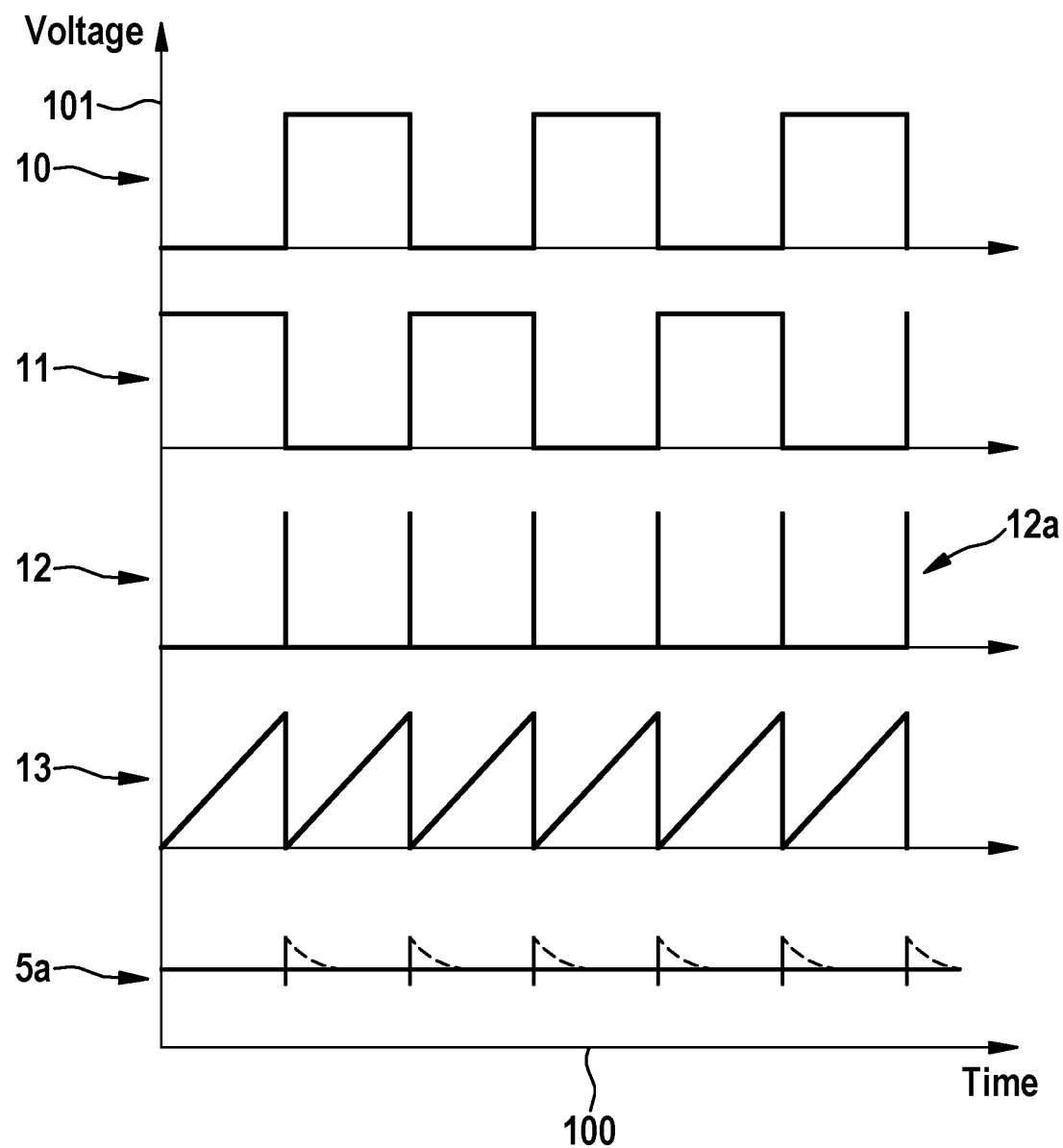
FIG. 2 shows different forms of voltage signals at different spots in a MEMS sensor according to a specific embodiment of the present invention.

FIG. 2 shows different forms of voltage signals at different spots in a MEMS sensor according to a specific embodiment of the present invention.

In FIG. 2, different signal characteristics are shown as voltages 101 versus time 100; the representation also illustrating the temporal relationship between these signal characteristics. In the upper region, the time characteristic of the voltage signal 10 for driving electrode 20*a* is shown. This is followed below it by the time characteristic of voltage signal 11 for driving electrode 21*a*. This, in turn, is followed below it by the time characteristic of control signal 12*a* of phase control device 12. The characteristic of charging voltage 13 of capacitor 3*a* is shown underneath the characteristic of control signal 12*a*, and under this, in turn, the time characteristic of the potential on deflectable seismic mass 5*a* is shown. In this context, voltage signals 10, 11 have a square-wave characteristic; these being, in each instance, opposed to each other, that is, voltage signal 10 is 180° out-of-phase from voltage signal 11. In this context, the frequency of square-wave voltage signals 10, 11 corresponds to the resonant frequency of seismic mass 5*a*.

Control signal 12*a* is made up of individual pulses of a short duration and a particular magnitude, which correspond to each edge change of square-wave voltage signals 10, 11. Capacitor 3*a* is discharged at each individual pulse of control signal 12*a* and is recharged between these individual pulses. Accordingly, voltage 13 increases at capacitor 3*a* of compensation device 3 between each of the individual pulses of control signal 12*a*, in order to decrease to zero again at each individual pulse; on the whole, the characteristic of voltage 13 is sawtooth-shaped. The potential on seismic mass 5*a* has a defined magnitude, but increases in a "peak-shaped" manner at each edge change of control signals 10 and 11. With the aid of compensation device 3, the potential on seismic mass 5*a* decreases immediately to its earlier magnitude, which is shown here by the solid lines. The dashed lines show the behavior of the potential on seismic mass 5*a*, when compensation device 3 is switched off. In this case, the potential on seismic mass 5*a* decreases substantially exponentially only after a certain time span, which is limited by the bandwidth of closed control loop 4.

Figure 3:
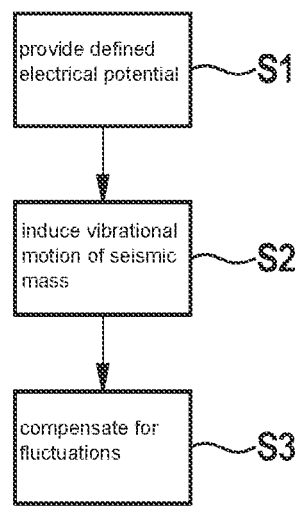
FIG. 3 shows steps of a method according to a specific embodiment of the present invention.

FIG. 3 shows steps of a method according to a specific embodiment of the present invention.

A method for operating a capacitive MEMS sensor is shown in FIG. 3. In this case, the method includes the following steps.

In a first step S1, a defined electrical potential is provided on a deflectably mounted, seismic mass of the MEMS sensor.

In a second step S2, a vibrational motion of the seismic mass is capacitively induced with the aid of a clocked electrical control voltage.

In a further step S3, fluctuations in the supplied electrical potential on the seismic mass caused by the clocked electrical control voltage are compensated for, by selectively charging and/or discharging an electrical storage element connected to the seismic mass in accordance with the frequency of the clocked electrical control voltage.

In summary, at least one of the specific embodiments of the present invention has at least one of the following advantages:

The high-voltage control loop does not have to undertake immediate charge compensation via its charge pump.

Low power consumption of the high-voltage control loop.

Lower required bandwidths of the high-voltage control loop.

Simple manufacture.

Less space.

Although the present invention was described in light of preferred exemplary embodiments, it is not limited to them, but is modifiable in numerous ways.

What is claimed is:

1. A method for operating a capacitive MEMS sensor, comprising the following steps:
   supplying a defined electrical potential on a deflectably mounted seismic mass of the MEMS sensor;
   capacitively inducing a vibrational motion of the seismic mass using a clocked electrical control voltage; and
   compensating for fluctuations in the supplied electrical potential on the seismic mass caused by the clocked electrical control voltage, by selectively charging and/or discharging an electrical storage element connected to the seismic mass in accordance with a frequency of the clocked electrical control voltage.

2. The method as recited in claim 1, wherein the vibrational motion of the seismic mass is monitored, and the clocked electrical control voltage is adjusted to maintain a defined vibrational motion of the seismic mass.

3. The method as recited in claim 1, wherein a phase and/or amplitude of the vibrational motion of the seismic mass is measured, and the phase and/or amplitude of the clocked electrical control voltage is controlled to provide a defined vibrational motion of the seismic mass.

4. The method as recited in claim 1, wherein a control signal is generated, which is coupled to a phase of the clocked electrical control voltage, and by which the selective charging and/or discharging of the electrical storage element is initiated.

5. The method as recited in claim 1, wherein a charge on the seismic mass to be compensated for is determined as a product of an amplitude of the vibrational motion of the seismic mass, a magnitude of the clocked electrical control voltage, and an operational sensitivity of the capacitance as a function of a deflection, and the charging current for the electrical storage element is determined as a product of two times a resonant frequency of an oscillator of the seismic mass and the charge to be compensated for.

6. A capacitive MEMS sensor, comprising:
   a deflectably mounted seismic mass;
   a circuit device configured to supply a defined electrical potential on the seismic mass;
   an excitation device configured to capacitively set the seismic mass into vibrational motion;
   a driving device configured to supply a clocked electrical control voltage to capacitively induce a vibrational motion of the seismic mass using the excitation device; and
   a compensation device having an electrical storage element, the compensation device being connected to the seismic mass, and being configured to compensate for fluctuations in an electrical potential on the seismic mass caused by the clocked electrical control voltage, by selectively charging and/or discharging the electrical storage element in accordance with a frequency of the clocked electrical control voltage.

7. The MEMS sensor as recited in claim 6, wherein the circuit device includes at least one charge pump, which is connected to the seismic mass.

8. The MEMS sensor as recited in claim 6, wherein the circuit device is configured to monitor the electrical potential on the seismic mass and adjust the electrical potential in accordance with a predefined reference voltage.

9. The MEMS sensor as recited in claim 6, wherein the driving device includes a circuit arrangement configured to monitor the vibrational motion of the seismic mass, the circuit arrangement configured to ascertain changes in an amplitude and/or a phase of the vibrational motion of the seismic mass to supply the clocked electrical control voltage.

10. The MEMS sensor as recited in claim 9, wherein the driving device includes at least an amplitude controller and/or a phase controller configured to control an amplitude and/or phase of the clocked electrical control voltage, to maintain a defined vibrational motion of the seismic mass.

11. The MEMS sensor as recited in claim 6, wherein the driving device is connected to the compensation device, and is configured to transmit a control signal to the compensation device in accordance with a frequency of the electrical control voltage, and the compensation device is configured to selectively charge and/or discharge the electrical storage element in accordance with the control signal.

12. The MEMS sensor as recited in claim 11, wherein the compensation device includes at least one current source configured to charge the electrical storage element and at least one switch configured to discharge the electrical storage element, and the at least one switch is able to be operated via the control signal of the driving device.

13. The MEMS sensor as recited in claim 6, wherein the electrical storage element is a passive electrical storage element.

14. The MEMS sensor as recited in claim 13, wherein the passive electrical storage element is a capacitor.

15. The MEMS sensor as recited in claim 12, wherein the at least one current source includes a digital-to-analog converter having a current output, which is configured to provide a plurality of selectable current generators.

16. The MEMS sensor as recited in claim 6, wherein the MEMS sensor is a gyroscope.

* * * * *